US005859547A

United States Patent [19]
Tran et al.

[11] Patent Number: 5,859,547
[45] Date of Patent: Jan. 12, 1999

[54] DYNAMIC LOGIC CIRCUIT

[75] Inventors: Dzung Joseph Tran; Mark Warren Acuff, both of Hillsboro, Oreg.

[73] Assignee: TransLogic Technology, Inc., Beaverton, Oreg.

[21] Appl. No.: 779,012

[22] Filed: Dec. 20, 1996

[51] Int. Cl.[6] .............................................. H03K 19/003
[52] U.S. Cl. ............................... 326/98; 326/121; 326/95
[58] Field of Search ................................ 326/93, 95, 98, 326/121

[56] References Cited

U.S. PATENT DOCUMENTS

| 4,569,032 | 2/1986 | Lee | 364/787 |
|---|---|---|---|
| 4,692,637 | 9/1987 | Shoji | 307/443 |
| 4,700,086 | 10/1987 | Ling et al. | 307/443 |
| 4,849,658 | 7/1989 | Iwamura et al. | 326/93 |
| 4,899,066 | 2/1990 | Aikawa et al. | 326/93 |
| 5,008,569 | 4/1991 | Roy | 307/465 |
| 5,023,486 | 6/1991 | Gongwer | 307/465 |
| 5,070,262 | 12/1991 | Hashimoto | 307/475 |
| 5,208,489 | 5/1993 | Houston | 307/451 |
| 5,402,012 | 3/1995 | Thomas | 326/97 |
| 5,453,708 | 9/1995 | Gupta et al. | 326/98 |
| 5,530,380 | 6/1996 | Kondoh | 326/98 |

OTHER PUBLICATIONS

Goncalves et al., "NORA: A Racefree Dynamic CMOS Technique for Pipelined Logic Structures," *IEEE Jour. Sol--Sta Cir*, vol. Sc–18, No. 3, pp. 261–266 (Jun. 1983).

Krambeck et al., "High–Speed Compact Circuits with CMOS," *IEEE Jour. Sol–Sta Cir*, vol. SC–17, No. 3, pp. 614–619 (Jun. 1982).

Lee et al., "Zipper CMOS," *IEEE Circuits and Devices Magazine*, vol. 2, pp. 10–16 (May 1986).

Weste et al., "5.4.7 CMOS Domino Logic," Chap. 5, *Principles of CMOS VLSI design: a systems perspective*, Library of Congress, 2nd ed., pp. 308–344 (1993).

*Primary Examiner*—Jon Santamauro
*Assistant Examiner*—Don Phu Le
*Attorney, Agent, or Firm*—Klarquist Sparkman Campbell Leigh & Whinston, LLP

[57] ABSTRACT

A dynamic logic circuit that uses substantially constant power and that has substantially constant propagation delay, independent of the number of inputs the dynamic logic circuit contains. In one embodiment of the circuit, an evaluation transistor is positioned between a precharge transistor and a dynamic logic block. The evaluation transistor separates a precharge node from the logic block during a precharge clock phase so that the logic block is not charged. A delay coupled to the precharge transistor allows the precharge transistor to remain activated during a portion of an evaluation clock phase to overcome any effects of charge-sharing between the precharge node and the dynamic logic block. Because the evaluation transistor separates the logic block from the precharge node, the precharge node can be charged independently of the number of inputs present in the dynamic logic block.

22 Claims, 5 Drawing Sheets

FIG. 4A
CLOCK SIGNAL

Precharge Phase

Evaluation Phase

FIG. 4B
DELAYED CLOCK SIGNAL AT GATE OF PRECHARGE TRANSISTOR

PRECHARGE TRANSISTOR ACTIVATED 400

PRECHARGE TRANSISTOR DEACTIVATED 402

FIG. 4C
INPUT SIGNALS

FIG. 4D
CLOCK SIGNAL AT GATE OF EVALUATION TRANSISTOR

EVALUATION TRANSISTOR DEACTIVATED

EVALUATION TRANSISTOR ACTIVATED

FIG. 4E
CHARGING OF DYNAMIC LOGIC BLOCK DURING PORTION OF EVALUATION PHASE

404

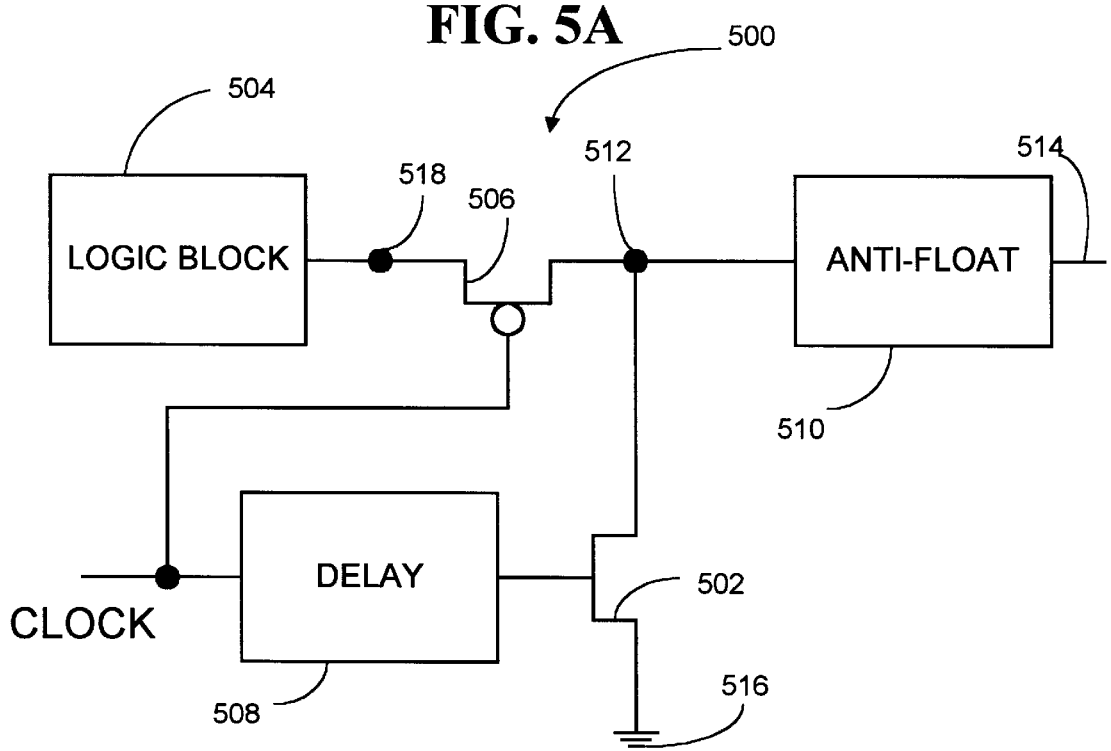
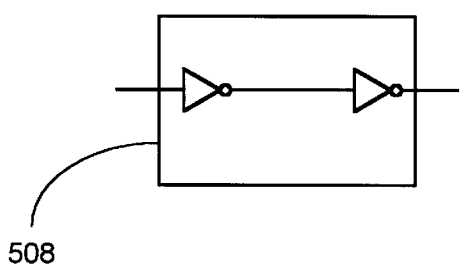
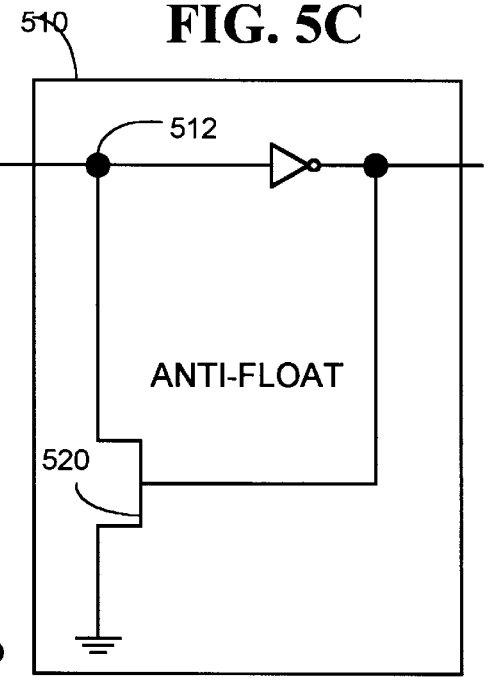
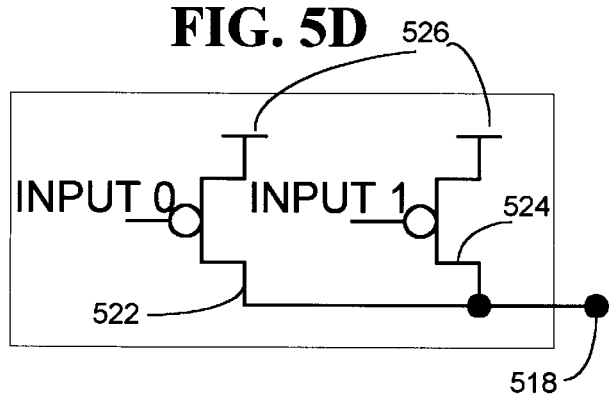

DYNAMIC LOGIC CIRCUIT

FIELD OF THE INVENTION

This invention relates generally to electronic circuits and, more particularly, relates to implementing logic functions using a high-speed and low-power dynamic logic circuit.

BACKGROUND OF THE INVENTION

Dynamic circuits have achieved widespread use because they require less silicon area and have superior performance over conventional static circuits. Unlike static circuits, dynamic circuits store data in the form of charge that dissipates in a short period of time due to leakage current. Consequently, dynamic circuits must periodically refresh the charge in order to properly retain data. A well-known dynamic circuit is a dynamic random access memory (DRAM) that stores data on charged capacitors.

Dynamic circuits can also be used to implement logic functions. An example of a dynamic logic circuit is shown in FIG. 1A, where a four-input logic function is implemented. A circuit 100 includes a precharge transistor 112 tied to power (Vdd), an evaluation transistor 114 tied to ground and a logic block 116 (shown in dashed lines) coupled between the precharge and evaluation transistors. Logic block 116 has a group of three input transistors 118, 120, 121 coupled in series and one input transistor 122 coupled in parallel across the other input transistors. A clock signal path 123 is coupled to the precharge and evaluation transistors.

FIG. 1B shows a waveform of a clock signal on the path 123. The signal has precharge and evaluation portions in its clock cycle which correspond to precharge and evaluation phases of the circuit. During the precharge phase, transistor 112 is active (operating near or in saturation), charging a precharge node 124 and the logic block 116 to a logic high voltage level. Conversely, transistor 114 is inactive (substantially turned off) during the precharge phase. With precharge node 124 at a high voltage level, a primary output 126 is at a logic low voltage level because inverting buffer 128 inverts the output of node 124.

During the evaluation phase, the evaluation transistor 114 is active and the precharge transistor is inactive. If each serially coupled input transistor 118, 120, 121 in logic block 116 is activated or if input transistor 122 is activated, then the logic block is said to be "conducting" (substantially a short circuit), and the evaluation transistor pulls the precharge node 124 and the logic block 116 low. Otherwise, the precharge node and the logic block remain at their precharged level.

Each transistor in the logic block has an associated capacitance (not shown). The precharge transistor 112 must be large enough to charge all of the transistors in the logic block 16 during the precharge phase. If the precharge transistor is too small, the capacitance of the transistors in the logic block may absorb enough charge to prevent the voltage on node 124 from rising to a high voltage level.

The more sophisticated the circuit, the more input transistors are needed in the logic block, and the larger the precharge transistor must be in order to overcome the capacitance of the logic block. Increasing the size of the precharge transistor increases the area and power used by the circuit. Moreover, increasing capacitance of the logic block increases the propagation delay (i.e., slows the speed) of the circuit. The speed of the circuit is determined by how fast the evaluation transistor can remove charge from the precharged logic block and the precharge node. The more inputs in the logic block, the greater the charge that the evaluation transistor must remove, and, hence the slower the circuit. Thus, power, area and speed are all related to the number of inputs to the circuit. The greater the number of inputs, the greater the amount of power needed to run the circuit, the greater the area the circuit uses, and the greater the circuit's propagation delay.

Using the circuit of FIG. 1, designers must weigh the advantages of including new features into a circuit against the increase in power, area and propagation delay as a result of the new features.

It is, therefore, desirable to have a circuit that has constant power and propagation delay regardless of the number of inputs to the dynamic logic block.

FIG. 2 shows a known dynamic logic circuit that attempts to overcome the problems of the FIG. 1 circuit. A precharge transistor 200 is isolated from a logic block 202 by an evaluation transistor 204. Each transistor $T_0$–$T_4$ in the logic block 202 has an associated capacitance that is represented by capacitors $C_0$–$C_4$. A precharge node 206 also has capacitance associated with it as represented by a capacitor $C_5$. Unlike FIG. 1, the precharge transistor 200 does not charge the logic block 202 to an appropriate high voltage level during the precharge phase. Instead, the evaluation transistor 204 is off during the precharge phase, isolating the precharge transistor from the logic block. The precharge transistor of FIG. 2 may be smaller, consequently, than the precharge transistor in the circuit of FIG. 1, thereby saving power and area.

Nonetheless, the circuit of FIG. 2 is generally considered a poor design because charge-sharing between the logic block and the precharge node during the evaluation phase can cause the precharge node to undesirably go low. See *Principles of CMOS VLSI Design: A System Perspective*, 2nd Edition, by Neil Weste and Kamran Eshraghian, FIG. 5.37(a). For example, assume the inputs $I_1$–$I_4$ are high (transistors $T_1$–$T_4$ are active), while input $I_0$ is low (transistor $T_0$ is inactive). When the evaluation phase begins, all of the charge associated with capacitor $C_5$ (stored during the precharge phase) is shared with capacitors $C_1$–$C_4$ because the elevation transistor allows current to flow therebetween. Given the inputs, the output is supposed to be a logic low (since $T_0$ is inactive). Instead, the capacitors $C_1$–$C_4$ absorb enough charge from capacitor $C_5$ that the circuit output erroneously goes high. The larger the number of inputs, the more charge-sharing that occurs and the more likely the circuit will improperly operate.

An objective of the invention, therefore, is to provide a dynamic logic circuit that is capable of providing substantially constant power and speed regardless of the number of inputs to the dynamic logic block in the circuit. A further object of the invention is to provide a dynamic logic circuit wherein the size of the precharge transistor is substantially independent of the number of inputs in the logic block. Yet a further object is to provide such a dynamic logic circuit that is faster, uses less area and uses less power than prior dynamic logic circuits. Still a further object of the invention is to provide a circuit that overcomes charge-sharing that occurs between the logic block and the precharge node.

SUMMARY OF THE INVENTION

The present invention provides a dynamic logic circuit that has increased speed and reduced power. Moreover, the power and speed of the circuit are substantially constant, regardless of the number of inputs the circuit contains. The circuit also allows for a precharge transistor that is a substantially constant size, regardless of the number of inputs.

In one embodiment, a dynamic logic circuit includes a precharge transistor for precharging a precharge node of the circuit to a predetermined voltage level, such as a logic high or a logic low. A logic block contains one or more input transistors that receive input signals to the dynamic logic circuit. An evaluation transistor is positioned between the logic block and the precharge transistor and electrically uncouples the logic block from the precharge node during a precharge phase so that the precharge node is unaffected by the capacitance of the logic block. A delay is coupled to the precharge transistor and ensures that the precharge transistor is activated for at least a portion of an evaluation phase to charge the logic block. Thus, charge-sharing between the precharge node and the dynamic logic block is overcome by an influx of additional charge at the start of the evaluation phase.

The delay can be accomplished a number of ways, including transmission line delays or RC delays. The delay can also be a buffer, such as a pair of inverters.

In another aspect of the invention, an anti-float device, such as a latch, is used to prevent the output node from floating or otherwise losing the current state of the circuit.

The circuit according to the invention has several advantages. The precharge transistor is isolated from the logic block by the evaluation transistor. Consequently, as the number of inputs of the logic block increases, the precharge transistor is unaffected by any increase in capacitance of the logic block. Moreover, the electrical uncoupling of the precharge node from the logic block allows the precharge transistor to be a constant size regardless of the number of inputs the circuit contains. The precharge transistor only needs to be large enough to charge the precharge node. Still further, power is also saved by only charging the precharge node during the precharge phase, rather than the precharge node and the logic block. Finally, the dynamic logic circuit according to the invention is faster because only the precharge node needs to be pulled to the proper voltage level when the logic block is conducting, rather than the logic block and the precharge node. This allows the speed of the circuit to be constant, regardless of the number of inputs.

These advantages and other advantages and features of the invention will become apparent from the following description of a preferred embodiment, which proceeds with reference to the following drawings.

BRIEF DESCRIPTION OF THE DRAWINGS

FIGS. 4A–4E show timing diagrams of the dynamic logic circuit of FIG. 3A.

FIG. 5A is a schematic diagram of a second embodiment of a dynamic logic circuit according to the invention, including a logic block, a delay and an anti-float device.

FIG. 5B is a schematic diagram of the delay of FIG. 5A.

FIG. 5C is a schematic diagram of the anti-float device of FIG. 5A.

FIG. 5D is a schematic diagram of the logic block of FIG. 5A.

DETAILED DESCRIPTION OF THE PREFERRED EMBODIMENT

Figure 3A:
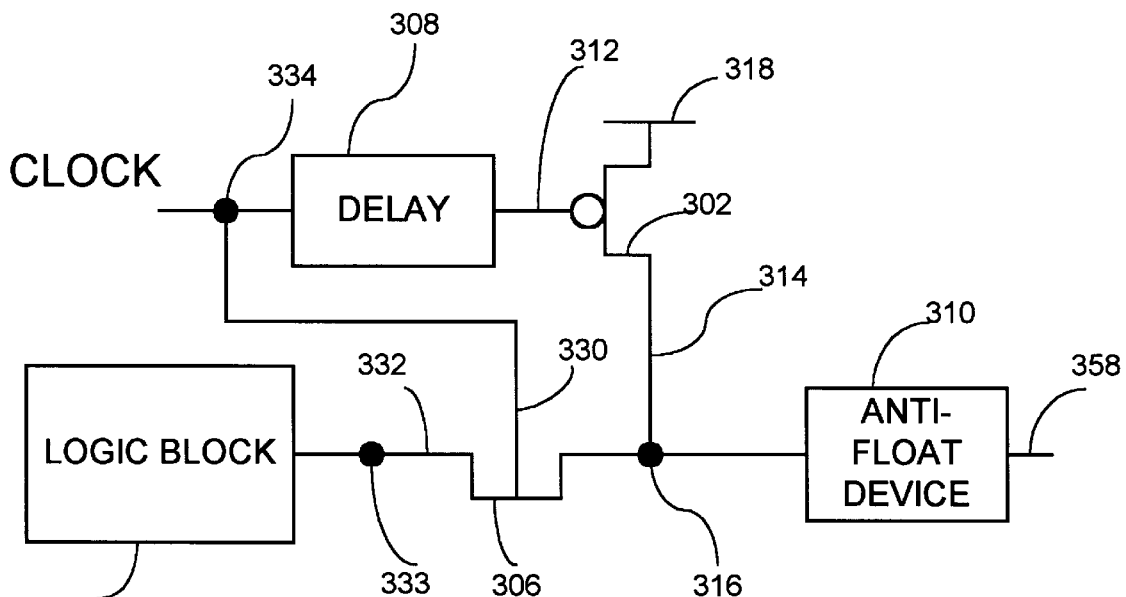
FIG. 3A is a schematic diagram of a dynamic logic circuit according to the invention, including a logic block, a delay and an anti-float device.

FIG. 3A shows a dynamic logic circuit 300 according to the present invention. The dynamic logic circuit 300 includes a precharge transistor 302, a logic block 304, and an evaluation transistor 306 positioned between the logic block and precharge transistor. The dynamic logic circuit 300 also includes a delay 308 and an anti-float device 310.

The precharge transistor 302 is a P-channel MOS transistor having a gate 312 and a source-to-drain path 314. The source-to-drain path 314 is coupled at one end to a precharge node 316 and at an opposed end to a positive supply voltage (e.g., 5-volt supply) denoted by horizontal line 318. The P-channel transistor is activated when a logic low voltage level is applied to the gate 312. Conversely, the precharge transistor is deactivated when the voltage level on gate 312 is a logic high.

The evaluation transistor 306 includes a gate 330 and a source-to-drain path 332. The source-to-drain path is coupled at one end to a logic-block output node 333 and at an opposed end to the precharge node 316. The gate 330 is coupled to a clock node 334 for receiving a clock signal. The evaluation transistor is an N-channel MOS transistor and, as such, is activated when a logic high voltage level is applied to the gate 330. Conversely, the N-channel transistor is deactivated when a logic low voltage level is applied to the gate.

A clock signal applied to the clock node 334 switches between logic low and logic high voltage levels, as depicted in FIG. 4A. During an evaluation phase of the clock cycle, the evaluation transistor 306 is activated. As a result, the evaluation transistor 306 electrically couples the precharge node 316 and the logic-block output node 333 so that charge can flow therebetween. During the precharge portion of the clock cycle, the evaluation transistor is deactivated, and the nodes 316 and 333 are electrically uncoupled so that no charge can pass therebetween (except for leakage current through the evaluation transistor).

The logic block 304 is so named because it determines the logical function of the dynamic logic circuit 300. The logic block includes one or more input transistors that can be arranged in any configuration to provide a desired logic function. An example of a logic block 304 is shown in FIG. 3D. The logic block is shown with two input transistors 335 and 336, each having an input signal (Input 0 and Input 1, respectively) coupled to their gates. The input transistors are coupled between the logic-block output node 333 and a negative supply voltage, in this case, ground 338.

The node 333 can have two states. In one state, the node 333 is floating (meaning it has no defined voltage level). The node 333 floats when the input signals are such that no electrical path exists between the node 333 and the ground terminals 338. In a second state, the node 333 is grounded or is a logic low voltage level. In the second state, the input signals are such that an electrical path is conducting from ground 338 to the node 333.

Although FIG. 3D shows the input transistors as being N-channel transistors coupled in parallel, the input transistors may also be P-channel transistors or P- and N-channel transistors mixed together. Additionally, the transistors can be arranged all in parallel, all in series, or a series/parallel combination. One input transistor is usually provided in the logic block for each input signal. Consequently, more complicated functions with more input signals require logic blocks with additional input transistors.

The delay 308 is coupled between the gate 312 of the precharge transistor 302 and the clock node 334. The delay 308 delays the clock signal so that the signal at the gate 312 of the precharge transistors receives a phase-shifted clock signal.

Figure 3B:
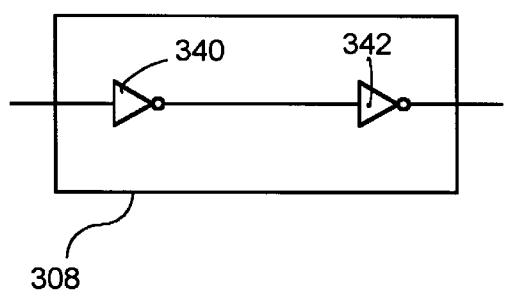
FIG. 3B is a schematic diagram of the delay element of FIG. 3A.

FIG. 3B shows an example of a delay circuit 308 used in the present invention. The delay 308 includes two serially coupled inverters, 340 and 342. The clock signal is delayed by the propagation delay of each inverter. Using the illustrated delay, the clock signal is phase-shifted by between 200 and 500 picoseconds. Although the delay is shown as serially coupled inverters, the delay 308 may also be accomplished using transmission-line delays or RC delays. Other types of delay circuits are well-known in the art and may be used.

Figure 3C:
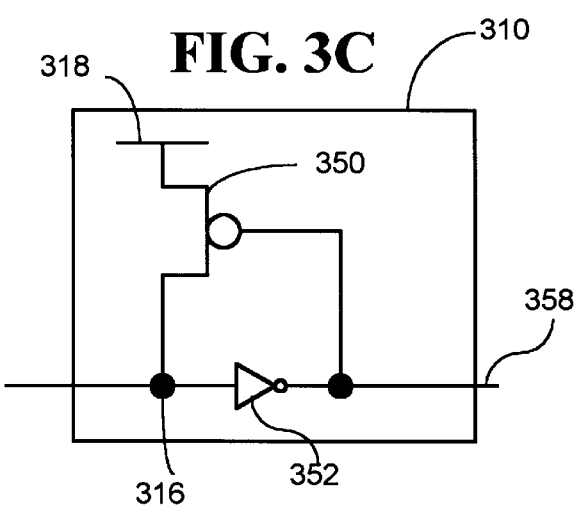
FIG. 3C is a schematic diagram of the anti-float device of FIG. 3A.
Figure 3D:
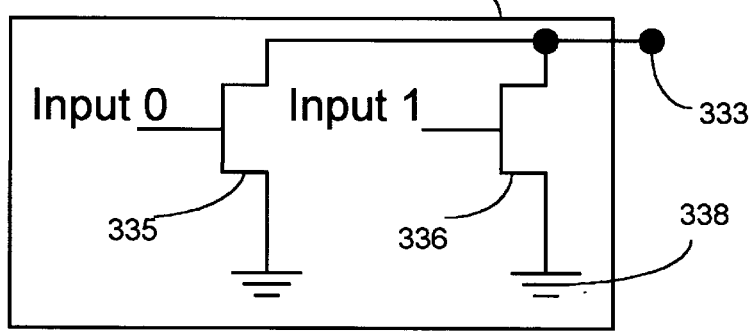
FIG. 3D is a schematic diagram of the logic block of FIG. 3A.

The anti-float device 310 is shown in more detail in FIG. 3C. The anti-float device is optional, meaning it does not necessarily need to be included in the circuit. The anti-float device includes a P-channel transistor 350 having a source-to-drain path coupled at one end to the precharge node 316 and at an opposed end to a positive voltage supply terminal 318. An inverter 352 is coupled between the precharge node and a gate on the P-channel transistor 350. The illustrated anti-float device is an inverting latch that maintains the voltage level on the precharge node 316 when the precharge node has a logic high voltage level thereon. A circuit output 358 is the output of the inverter 352. As a result, the circuit output is an inverted version of the precharge node.

Although the anti-float device is shown as an inverting latch, many different types of anti-float devices may be used, including non-inverting latches and flip-flops.

FIGS. 4A–4E show a timing diagram of the circuit of FIG. 3. FIG. 4A shows a clock signal having a precharge phase when the clock signal is a logic low voltage level and an evaluation phase when the clock signal is a logic high voltage level.

Referring to FIGS. 3A and 4B, FIG. 4B shows the delayed clock signal received at the gate 312 of the precharge transistor 302. The delayed clock signal is a phase-shifted version of the clock signal of FIG. 4A. The phase shift corresponds to the length of the delay 308. In the illustrated circuit 300, the delay is equal to the propagation delay through two inverters 340, 342. During portion 400 of the delayed clock signal, the precharge transistor 302 is activated and the evaluation transistor 306 is deactivated. As a result, the precharge node 316 is charged to a logic high voltage level by the current flowing from the positive voltage supply 318 through the source-to-drain path 314 of the precharge transistor. "Charging" refers to substantially equalizing the energy potential on the precharge node to the voltage supply coupled to the source-to-drain path of the precharge transistor. The precharge node may not have the identical energy potential as the voltage supply because of a voltage drop across the precharge transistor. During portion 400 of the delayed clock signal, the evaluation transistor 306 is deactivated, as shown in FIG. 4D. The evaluation transistor electrically uncouples the logic block and the precharge node (so substantially no charge flows therebetween). As a result, the logic-block output node 333 is not charged by the precharge transistor during the portion 400 of the delayed clock signal.

Figure 2:
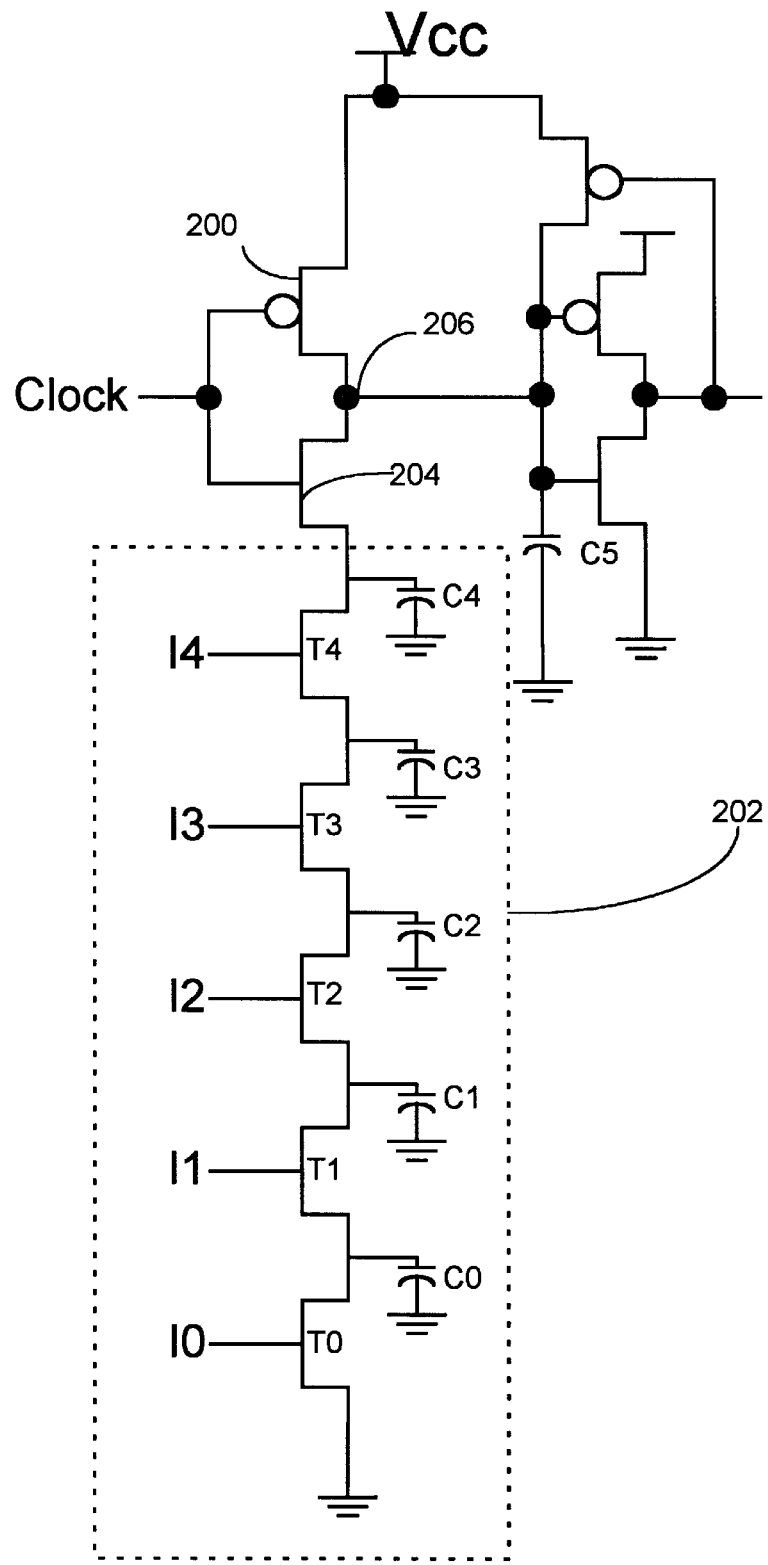
FIG. 2 is a schematic diagram of a known dynamic logic circuit that is problematic due to charge-sharing between a precharge node and a logic block during the evaluation phase.

During the portion 402 of the delayed clock, the precharge transistor is activated, and the evaluation transistor is also activated. During the portion 402, the evaluation transistor electrically couples (i.e., charge can flow between) the precharge node and the logic block. Thus, the precharge transistor charges the logic block through the evaluation transistor. This charging of the logic block overcomes the problems shown in the circuit of FIG. 2. In the circuit of FIG. 2, the precharge node loses substantial charge when the evaluation transistor is activated (at the start of the evaluation phase) because of charge-sharing among other transistors in the logic block. This may result in erroneous voltage levels on the precharge node.

By contrast, the circuit of FIG. 3A charges the logic block during a portion of the evaluation phase to overcome any charge-sharing that occurs at the start of the evaluation phase. This charging occurs because the precharge transistor and the evaluation transistor are activated simultaneously for a period of time sufficient for the precharge transistor to properly charge the dynamic logic block.

Figure 1A:
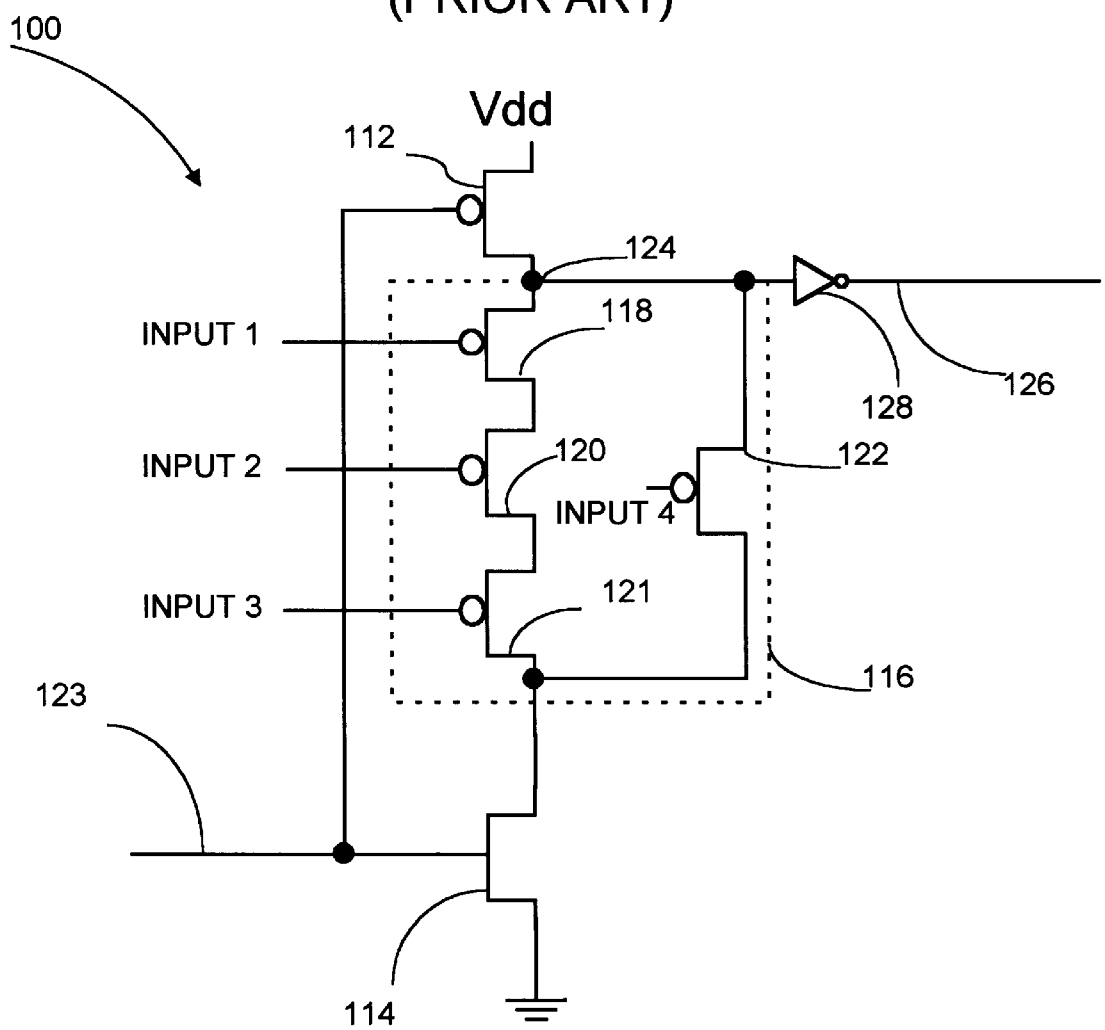
FIG. 1A is a schematic diagram of a known dynamic logic circuit implementing a logic function.
Figure 1B:
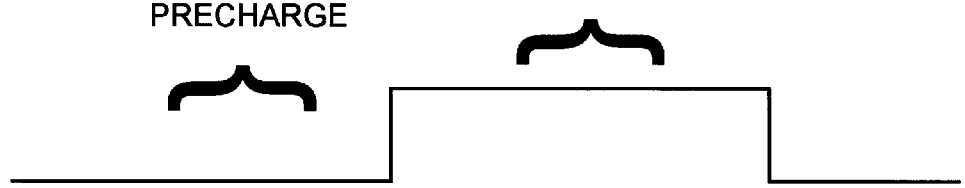
FIG. 1B is a timing diagram of a clock signal having a precharge and an evaluation phase.

As shown in FIG. 4C, the input signals to the logic block become valid sometime during the portion 400 of the delayed clock signal. Depending upon the input signals and the configuration of the transistors in the logic block 304, the logic-block output node 333 is either floating (i.e., logic block not conducting) or pulled to ground (i.e., logic block conducting). This should be contrasted with the prior art circuit shown in FIG. 1A, where the logic block 116 is also charged during the precharge phase to the same voltage level as the precharge node.

In the circuit of FIG. 3A, if the inputs allow the logic-block output node 333 to be grounded, then at the start of the evaluation phase, only charge on the precharge node 316 needs to be pulled to ground. This allows for a significant speed advantage over the prior art. Additionally, the speed of the circuit is substantially constant regardless of the number of inputs to the logic block.

FIG. 4E shows an overlap period 404 during which the precharge transistor and the evaluation transistor are both simultaneously activated. This time is preferably between a minimum of 0.1 nanoseconds and a maximum of 1.0 nanoseconds.

FIGS. 5A–5D show an alternative embodiment of the present invention with a dynamic logic circuit 500 having a precharge transistor 502, a logic block 504 and an evaluation transistor 506. The circuit 500 also includes a delay 508 coupled to a gate of the precharge transistor 502 and an anti-float device 510 coupled between a precharge node 512 and a circuit output 514.

The precharge transistor 502 is an N-channel transistor (rather than P-channel, as in FIG. 3A). Similarly, the evaluation transistor 506 is a P-channel transistor rather than N-channel. The precharge transistor 502 has a source-to-drain path that is connected between the precharge node 512 and a negative supply voltage, shown as ground 516.

The dynamic logic circuit 500 charges the precharge node 512 to a logic low voltage level (e.g., ground) during a precharge phase. In the FIG. 5 circuit, the precharge phase occurs when the clock signal is a logic high, and the evaluation phase occurs when the clock signal is a logic low.

A logic-block output node 518 has two potential states. Either the node is floating, or if the input signals to the logic block allow the logic block to conduct, then the node 518 is a logic high voltage level.

Because of delay 508, the precharge transistor 502 and evaluation transistor 506 are activated simultaneously for a short period of time during the evaluation phase. This allows the precharge transistor 502 to charge the logic block 504, in this case to a low voltage level.

FIG. 5B shows the delay 508 in more detail. Like FIG. 3B, the delay includes two inverters serially coupled together. Other possible delays have already been described in relation to FIG. 3B.

FIG. 5C shows the anti-float circuit 510 in more detail. The circuit is substantially similar to the circuit shown in FIG. 3C, but an N-channel transistor 520 is used as a pull-down transistor, rather than a P-channel pull-up transistor, as shown in FIG. 3C. The anti-float circuit 510 keeps the precharge node 512 to a logic low voltage level unless the logic block drives the precharge node high, in which case the pull-down transistor switches off, allowing the precharge node 512 to remain at a high voltage level.

FIG. 5D shows the logic block 504 in greater detail. In this case, the input transistors, such as input transistors 522 and 524, have a source-to-drain path coupled between a positive voltage supply 526 and the logic-block output node 518. As with FIG. 3D, the input transistors can be a combination of P- or N-channel transistors coupled in parallel, serial, or any combination thereof.

The circuit shown in FIGS. 3 and 5 have several advantages over prior dynamic logic circuits:

1) The circuit uses substantially constant power regardless of the number of inputs to the dynamic logic block. In prior circuits, the more inputs, the more power the circuits use. In the illustrated embodiment of the invention, the evaluation transistor isolates the inputs from the precharge transistor and the precharge node. Consequently, the precharge transistor only charges the precharge node and not the input transistors in the logic block during the precharge phase. The charging of the precharge node requires substantially constant power independent of the number of inputs to the logic block. The word "substantially" is used because power does increase slightly with an increase in inputs. This is due to the brief charging of the logic block during the evaluation phase. This slight increase, however, is negligible compared to the power increase in prior dynamic circuits.

2) The circuit has substantially constant propagation delay, independent of the number of inputs the circuit contains. This is also the result of separation of the dynamic logic block from the precharge node. At the start of the evaluation phase, the logic-block output node is already charged to its proper state. If the logic block is conducting, only the charge on the precharge node needs to be changed. Consequently, the propagation delay of the circuit is substantially constant independent of the number of inputs the circuit contains.

3) The precharge transistor can be sized smaller than precharge transistors in prior circuits. Additionally, the precharge transistor can stay substantially the same size regardless of the number of inputs the circuit contains. This is also because of the isolation of the precharge node from the logic block during the precharge phase. The precharge transistor only needs to charge the precharge node. The precharge transistor also briefly charges the logic block, but this has little consequence on the sizing of the precharge transistor (the precharge transistor does increase in size slightly for more inputs, but nominally compared to prior circuits). Having the precharge transistor stay substantially the same size reduces the overall area that the circuit uses.

Having illustrated and described the principles of the invention in a preferred embodiment, it should be apparent to those skilled in the art that the embodiment can be modified in arrangement and detail without departing from such principles.

For example, although the precharge and evaluation transistors were shown as a combination of P- and N-channel transistors, both transistors may be P-channel, or both transistors may be N-channel. For example, the circuit in FIG. 3A may have the precharge transistor as an N-channel transistor. In such a case, the delay could be a single inventer, rather than two inverters coupled in series. Similarly, in FIG. 5A, the precharge transistor 502 can be a P-channel transistor with the delay having a single inverter.

Additionally, although the positive and negative voltage supplies are shown as ground and a standard digital power supply (i.e., 5 volts), other voltage supplies with different voltage levels can be used.

Moreover, the illustrated circuits can be physically implemented, as in an operating circuit, or the circuits can be a symbolic representation, such as that generated on computer. Typically, when generated on a computer, a netlist is created for fabrication from the symbolic representation.

The word "between" as used herein should not be interpreted as limited to a direct connection.

"Charging", as defined herein, refers to substantially equalizing the energy potential on the node (or logic block) being charged to the voltage source supplying the charge. Typically, the energy potential on the node is not identical to that of the source because of a voltage drop along the transmission line or through a transistor.

In view of the many possible embodiments to which the principles or invention may be applied, it should be recognized that the illustrated embodiment is only a preferred example of the invention and should not be taken as a limitation on the scope of the invention. Rather, the invention is defined by the following claims. We therefore claim as the invention all such embodiments that come within the scope of these claims.

We claim:

1. A dynamic logic circuit, comprising:
   a dynamic logic block;
   a precharge transistor;
   an evaluation transistor between the dynamic logic block and the precharge transistor; and
   a delay coupled to the precharge transistor for simultaneously activating the precharge and evaluation transistors.

2. The dynamic logic circuit of claim 1 wherein the precharge transistor includes a gate and a source-to-drain path, and the delay is coupled to the gate of the precharge transistor.

3. The dynamic logic circuit of claim 2 wherein the delay includes at least one inverter.

4. The dynamic logic circuit of claim 1 including an anti-float circuit coupled to the precharge transistor.

5. The dynamic logic circuit of claim 4 wherein the anti-float circuit includes a latch.

6. The dynamic logic circuit of claim 1 wherein the precharge and evaluation transistors each include a gate and a source-to-drain path, and the dynamic logic circuit includes a clock signal node coupled to the gates of the precharge and evaluation transistors for receiving a clock signal having precharge and evaluation phases for switching the precharge transistor between an active state during the precharge phase and an inactive state during a major portion of the evaluation phase and for switching the evaluation transistor between an inactive state during the precharge clock phase and an active state during the evaluation clock phase.

7. The dynamic logic circuit of claim 6 wherein the delay is coupled between the clock signal node and the gate of the precharge transistor.

8. The dynamic logic circuit of claim 1 wherein the precharge transistor is an N-channel transistor and the evaluation transistor is a P-channel transistor.

9. The dynamic logic circuit of claim 1 wherein the precharge transistor is a P-channel transistor and the evaluation transistor is an N-channel transistor.

10. The dynamic logic circuit of claim 1 wherein the dynamic logic block includes input transistors for receiving input signals and the dynamic logic circuit uses substantially constant power independent of the number of input transistors.

11. The dynamic logic circuit of claim 1 wherein the dynamic logic block includes input transistors for receiving input signals and the dynamic logic circuit has a substantially constant propagation delay independent of the number of input transistors.

12. A dynamic logic circuit, comprising:

a precharge transistor including a gate terminal and a source-to-drain path coupled between a first-supply-voltage node and a precharge node;

a logic block including at least one transistor coupled between a second-supply-voltage node and a logic-block output node, said at least one transistor in the logic block further including a gate terminal couplable to an input signal;

an evaluation transistor having a source-to-drain path and a gate terminal, the source-to-drain path coupled between the logic-block output node and the precharge node, the gate terminal coupled to a clock signal node; and a delay coupled between the clock signal node and the gate terminal of the precharge transistor.

13. The dynamic logic circuit of claim 12 further including a clock signal coupled to the clock signal node, the clock signal having a precharge phase during which the precharge transistor is activated and the evaluation transistor is deactivated and an evaluation phase during which the evaluation transistor is activated.

14. The dynamic logic circuit of claim 12, further including coupling a positive supply voltage to the first-supply voltage node and a negative supply voltage to the second-supply-voltage node.

15. The dynamic logic circuit of claim 12, further including coupling a positive supply voltage to the second-supply-voltage node and a negative supply voltage to the first-supply-voltage node.

16. The dynamic logic circuit of claim 12 further including an anti-float circuit coupled to the precharge node.

17. The dynamic logic circuit of claim 12 wherein the precharge transistor is an N-channel transistor and the evaluation transistor is a P-channel transistor.

18. The dynamic logic circuit of claim 12 wherein the precharge transistor is a P-channel transistor and the evaluation transistor is an N-channel transistor.

19. A dynamic logic circuit, comprising:

a dynamic logic block having a plurality of input transistors, the arrangement of the input transistors determining the logic function of the circuit;

a precharge transistor for precharging an output of the dynamic logic circuit to a first voltage level during a precharge phase;

an evaluation transistor between the dynamic logic block and the precharge transistor for allowing charge sharing between the output of the dynamic logic circuit and the dynamic logic block; and the precharge and evaluation transistors are activated simultaneously for a period of time.

20. The dynamic logic circuit of claim 19 wherein the precharge transistor is responsive to a clock signal for switching between an active state during a precharge clock phase and an inactive state during a majority of the evaluation clock phase;

the evaluation transistor responsive to the clock signal for switching between an inactive state during the precharge clock phase and an active state during the evaluation clock phase; and wherein the precharge transistor is active during a period of time at a beginning of the evaluation clock phase sufficient for charging the dynamic logic block.

21. A method of precharging and evaluating a dynamic logic circuit, the method comprising the steps of:

switching a precharge transistor, using a clock signal, between an active state during a precharge clock phase and an inactive state during a major portion of an evaluation clock phase;

switching an evaluation transistor between an inactive state during the precharge clock phase and an active state during the evaluation clock phase;

delaying the precharge clock phase to the precharge transistor so that the precharge transistor is activated during a minor portion of the evaluation clock phase.

22. A dynamic logic circuit, comprising:

a dynamic logic block having input transistors all coupled in parallel;

a precharge transistor;

an evaluation transistor between the dynamic logic block and the precharge transistor;

a clock signal node directly connected to the evaluation transistor for switching the evaluation transistor between active and inactive states; and a delay coupled to the precharge transistor for delaying the clock signal to the precharge transistor with respect to the evaluation transistor.

* * * * *